United States Patent [19]
Tamai

[11] Patent Number: 5,929,456
[45] Date of Patent: Jul. 27, 1999

[54] ION IMPLANTATION SYSTEM AND METHOD ADAPTED FOR SERIAL WAFER PROCESSING

[75] Inventor: Tadamoto Tamai, Tokyo, Japan

[73] Assignee: Ebara Corporation, Tokyo, Japan

[21] Appl. No.: 08/960,316

[22] Filed: Oct. 29, 1997

[30] Foreign Application Priority Data

Oct. 30, 1996 [JP] Japan ................................. 8-288860

[51] Int. Cl.⁶ ..................... H01L 21/265; H01J 37/317
[52] U.S. Cl. ................................ 250/492.21; 250/442.11
[58] Field of Search ........................... 250/492.21, 442.11

[56] References Cited

U.S. PATENT DOCUMENTS

| 5,003,183 | 3/1991 | Nogami et al. | 250/492.21 |
| 5,194,748 | 3/1993 | Aitken | 250/442.11 |

FOREIGN PATENT DOCUMENTS

| 3-154791 | 7/1991 | Japan . |
| 09038875 | 2/1997 | Japan . |

*Primary Examiner*—Jack I. Berman
*Attorney, Agent, or Firm*—Armstrong, Westerman, Hattori, McLeland & Naughton

[57] ABSTRACT

A serial wafer processing type ion implantation system and method suitable for small production of many product types. The ion implantation method implants ions while a first wafer group including at least one or more wafers is rotated along a first orbital path intersecting with a path of an ion beam and while a second wafer group including at least one or more wafers is rotated along a second orbital path intersecting with the path of the ion beam, at least a portion of the second orbital path being different from the first orbital path.

15 Claims, 9 Drawing Sheets

ION IMPLANTATION SYSTEM AND METHOD ADAPTED FOR SERIAL WAFER PROCESSING

This application is based on Japanese Patent Application Hei 8-288860 filed on Oct. 30, 1996, the entire contents of which are incorporated herein by reference.

BACKGROUND OF THE INVENTION a) Field of the Invention

The present invention relates to an ion implantation system and method, and more particularly to a serial wafer processing type ion implantation system and method suitable for high dose ion implantation of large diameter wafers.

b) Description of the Related Art

Conventional high current ion implantation for wafers has used batch processing. For example, a plurality of wafers are placed on an inner circular cone surface of a circular cone plate in the circumferential direction. As the circular cone plate is rotated around its center axis, wafers revolves around the center axis of the circular cone plate. Each revolving wafer traverses an ion beam radiation area on a revolving orbit and ions are implanted at that time.

Each wafer placed on the inner surface of the circular cone plate is pushed against this surface by the centrifugal force. The inner surface of the circular cone plate is made of rubber or the like having good thermal conductivity so that the wafers in tight contact with the inner surface are cooled. Each wafer is heated once per one revolution while it is exposed to ion beams, and it is cooled during the other period. The temperature is maintained at 90 to 100° C. or lower during ion implantation.

A plurality of wafers are disposed in the circumferential direction in the above-described batch processing system. Therefore, if each wafer is large, the system becomes bulky. Furthermore, since the number of batch-processed wafers is large, if the wafer size is large, a number of chips are processed at the same time. This is not suitable for small production of many product types. Rotation of a circular cone may generate particles which may lower production yield.

SUMMARY OF THE INVENTION

It is an object of the present invention to provide a single wafer processing type ion implantation system and method suitable for large size wafers.

According to one aspect of the present invention, there is provided an ion implantation method wherein ion implantation is performed while a first wafer group including at least one or more wafers is rotated along a first orbital path intersecting with a path of an ion beam and while a second wafer group including at least one or more wafers is rotated along a second orbital path intersecting with the path of the ion beam, at least a portion of the second orbital path being different from the first orbital path.

While the first and second wafer groups move on the orbital path intersecting with the path of the ion beam, ions are implanted to wafers of the wafer groups. The wafer group traversed the path of the ion beam is returned to the original position via the orbital path of this wafer group. While ions are implanted to one wafer group, the other wafer group can be moved independently from the motion of the one wafer group.

According to another aspect of the present invention, there is provided an ion implantation method comprising the steps of: implanting ions while a first wafer is moved along one direction intersecting with a path of an ion beam; implanting ions to partial areas of the first wafer and a second wafer at the same time, by moving the second wafer along the one direction into the path of the ion beam before the first wafer perfectly escapes from the path of the ion beam; implanting ions while the second wafer is moved along the one direction after the first wafer perfectly escapes from the path of the ion beam; and implanting ions to partial areas of the first second wafers at the same time, by moving the first wafer along the one direction into the path of the ion beam before the second wafer perfectly escapes from the path of the ion beam.

Before one wafer escapes from the path of the ion beam, another wafer is made to enter-the path of the ion beam. It is therefore possible to improve the use efficiency of ion beams.

According to another aspect of the present invention, there is provided an ion implantation method of implanting ions by rotating first and second wafer groups each including at least one or more wafers along respective first and second orbital paths having at least a common orbital section intersecting with a path of an ion beam, wherein a relative distance between the first and second wafer groups along the first or second orbital paths varies while one of the first and second wafer groups moves on the common orbital section.

Since the two wafer groups are rotated on the orbital paths while changing the relative distance between wafers, it is possible to move one wafer group just before the path of the ion beam while ions are implanted to the other wafer group.

According to another aspect of the present invention, there is provided an ion implantation system comprising: first wafer transport means for holding at least one or more wafers and rotating at least one or more wafers along a first orbital path intersecting with a path of an ion beam; and second wafer transport means for holding at least one or more wafers and rotating at least one or more wafers along a second orbital path intersecting with a path of an ion beam.

Provision of the first and second wafer transport means can rotate two wafer groups independently on the orbital paths.

As above, ions can be efficiently implanted through single wafer processing.

DETAILED DESCRIPTION OF THE PREFERRED EMBODIMENTS

An ion implantation system according to an embodiment of the invention will be described with reference to FIGS. 1A to 1D.

Figure 1A:
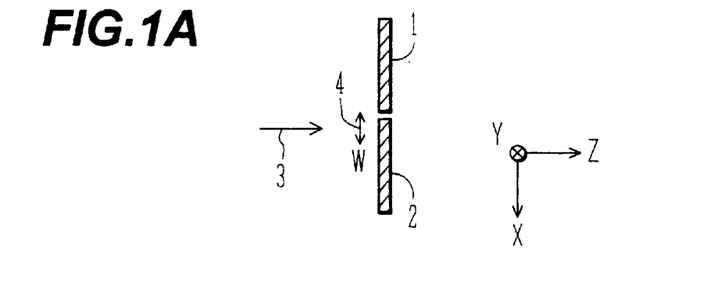
FIGS. 1A to 1D are diagrams illustrating the concept of an ion implantation method according to an embodiment of the invention.

As shown in FIG. 1A, wafers 1 and 2 are disposed in a line along a vertical direction (X direction), with the surfaces into which ions are implanted being directed to the left as viewed in FIG. 1A (−Z direction). An ion beam 3 moving to the +Z direction has a width W and exposes a long stripe region 4 extending in the direction (Y direction) perpendicular to the drawing sheet. For example, if an ion beam having a circular cross section of a diameter W is scanned in the Y direction, the whole area of the stripe region 4 can be exposed with ions. The wafers 1 and 2 move downward toward the +X direction in a line while the relative position therebetween is maintained. While each wafer traverses the ion beam radiation region 4, ions are implanted.

Figure 1B:
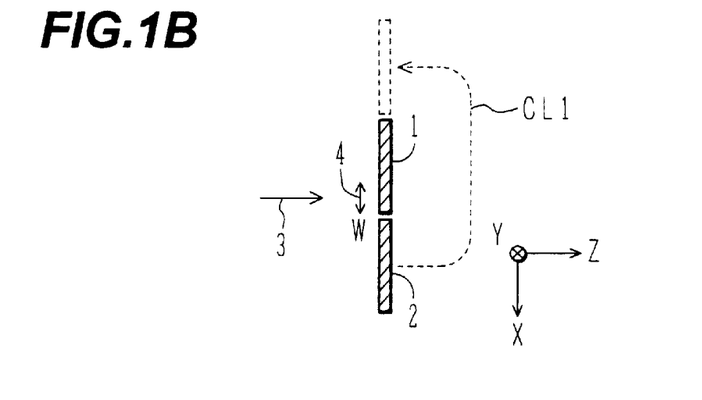

As shown in FIG. 1B, after the wafer 2 completely traverses the ion beam radiation region 4, it is transported upward (−X direction) as indicated by a broken line CL1. During this transportation period, the wafer 1 moves toward the +Z direction at a constant velocity.

Figure 1C:
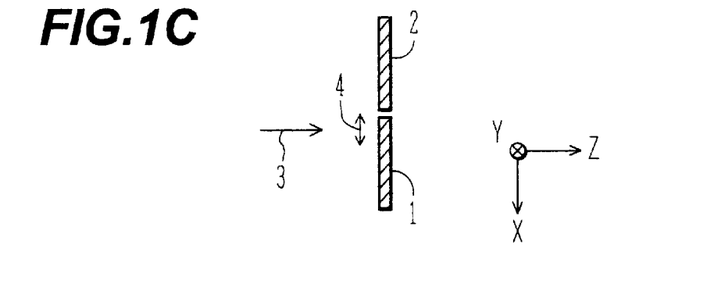

As shown in FIG. 1C, the wafers 1 and 2 move toward the +X direction. In this case, the vertical positions of the wafers 1 and 2 are reversed from those shown in FIG. 1A.

Figure 1D:
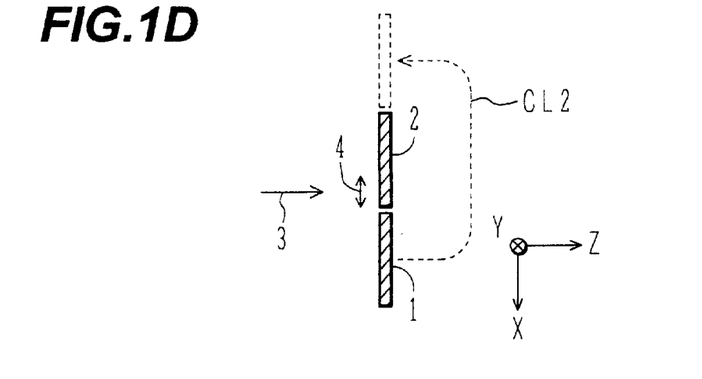

As shown in FIG. 1D, after the wafer 1 completely traverses the ion beam radiation region 4, it is transported upward (−X direction) as indicated by a broken line CL2, and positioned above the wafer 1. Thereafter, the wafers 1 and 2 are moved downward toward the +X direction as shown in FIG. 1A.

The processes shown in FIGS. 1A to 1D are repeated until ion implantation of the wafers 1 and 2 is completed.

A single wafer may be reciprocally moved along the X direction to perform ion implantation. However, in this case, the transport direction of the wafer is required to be reversed only after the outer circumference of the wafer perfectly escapes from the ion beam radiation region 4. Therefore, use efficiency of the ion beam lowers.

In this embodiment, however, two wafers can be transported by providing a mechanically controllable space therebetween, e.g., about 10 mm. The width W of the ion beam radiation region 4 is usually about 50 to 40 mm. Therefore, at the stage shown in FIG. 1A, before the wafer 2 perfectly escapes from the ion beam radiation region 4, the wafer 1 enters this region 4. Use efficiency of the ion beam can therefore be improved.

In the ion implantation method illustrated in FIGS. 1A to 1D, the wafers 1 and 2 move on the orbital path during the processes of FIGS. 1A and 1C. The orbital paths CL1 and CL2 shown in FIGS. 1B and 1D are not always the same, but the distance between the two wafers on the orbital paths CL1 and CL2 varies from time to time. If the distance between two wafers is always constant, it is not possible to make one wafer enter the ion beam radiation region before the other wafer perfectly escapes from this region. In such a case, ions cannot be efficiently implanted into two wafers as opposed to this embodiment.

Ion implantation is performed while the relative distance of the two wafers is varied occasionally, so that an efficient single wafer processing (more strictly, a concurrent process of two wafers at a minimum) becomes possible. Assuming that the relative distance between two wafers is varied from time to time for ion implantation, the orbital paths of the two wafers may be the same path.

In FIGS. 1A to 1D, a batch process of two wafers has been described. Instead of using the two wafers, two groups of a plurality of wafers may be used to perform the above processes if the relative positions of wafers of each group are fixed. Similarly, three or more groups of a plurality of wafers may be used.

Next, an ion implantation system for realizing the ion implantation method described with reference to FIGS. 1A to 1D will be described. FIGS. 2A to 2D are front views of an ion implantation system according to an embodiment of the invention, as viewed along the ion beam incidence direction.

Figure 2A:
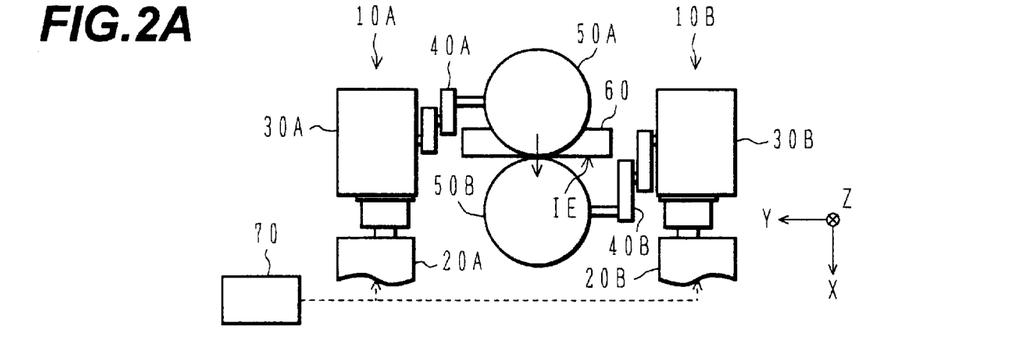
FIGS. 2A to 2D are front views of an ion implantation system used for illustrating the ion implantation method, according to an embodiment of the invention.

As shown in FIG. 2A, the ion implantation system of this embodiment is structured by wafer transport mechanisms 10A and 10B. The wafer transport mechanism 10A includes a horizontal rotation mechanism 20A, an arm drive mechanism 30A, an expandable arm 40A, and a wafer holder 50A. Consider an XYZ orthogonal coordinate system wherein the Z axis is set along an ion beam progressing direction (a direction from the front surface to the rear surface of the drawing sheet of FIG. 2A), the X axis is set along a downward vertical direction (a down side direction in FIG. 2A), and the Y axis is set along the left side direction as viewed in FIG. 2A.

The arm drive mechanism 30A is mounted on the horizontal rotation mechanism 20A. The horizontal rotation mechanism 20A can rotate the arm drive mechanism 30A around a rotary axis in parallel to the X axis.

The expandable arm 40A is mounted on the arm drive mechanism 30A. The wafer holder 50A is mounted on the distal end of the expandable arm 40A. The wafer holder 50A sucks and holds a wafer on a wafer holding surface by using an electrostatic chuck. Gas eject holes are formed in the wafer holder and exposed at the wafer holding surface, so that gas can be supplied in a space between the wafer holding surface and the wafer. Cooled water is supplied in the wafer holder 50a to cool the gas. The gas, which fills the space between the wafer holding surface and the wafer, functions as thermal conduction media and cools the wafer heated by ion implantation. The expandable arm 40A can move the wafer holder 50A in parallel to the X axis direction.

The wafer transport mechanism 10B has a structure symmetrical to the wafer transport mechanism 10A relative to a virtual plane which is in parallel to the XZ plane and passes through the center of the wafer holder 50A. Similar to the wafer transport mechanism 10A, the wafer transport mechanism 10B includes a horizontal rotation mechanism 20B, an arm drive mechanism 30B, an expandable arm 40B, and a wafer holder 50B.

When ions are implanted, the wafer holding surface of the wafer holder 50A or 50B is set, for example, perpendicular to the Z axis as shown in FIG. 2A which shows both the wafer holding surfaces set perpendicular to the Z axis. At the back (downstream of ion beam) of the wafer holder 50A in this state, an ion current detector 60 is mounted. An ion beam has generally a circular section in the XY plane, and is scanned in the Y axis direction to expose a region covered by the ion current detector 60.

An ion beam not intercepted by the wafer holders 50A and 50B becomes incident upon the ion current detector 60 which can measure the magnitude of ion current.

The horizontal rotation mechanisms 20A and 20B and arm drive mechanisms 30A and 30B are controlled by a controller 70.

Figure 3A:
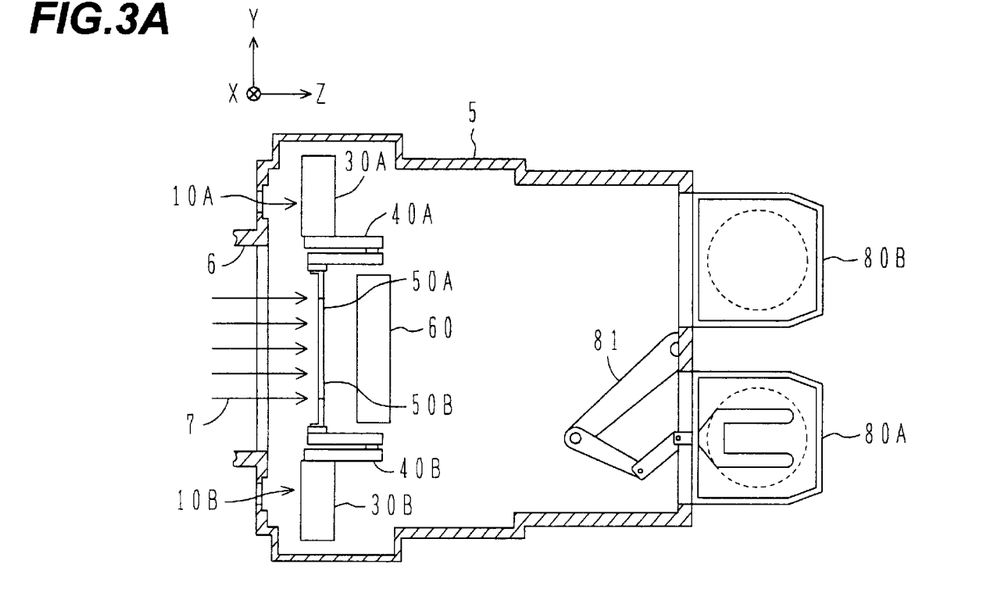
FIGS. 3A and 3B and FIG. 4 are cross sectional plan views of the ion implantation system according to the embodiment of the invention.

FIG. 3A is a schematic plan view in section showing the ion implantation system in the state shown in FIG. 2A. A process chamber 5 capable of being evacuated communicates with an ion beam source (not shown) via a window 6 formed in the side wall of the chamber. An ion beam 7 progressing to the +Z direction is introduced via the window 6 into the process chamber 5. The ion beam 7 is scanned along the Y axis. The wafer transport mechanisms 10A and 10B described with FIG. 2A are mounted in this process chamber 5, and one or both of wafers held by the wafer holders 50A and 50B are exposed to the ion beam 7. At the back of the wafer holders SOA and 50B, the ion current detector 60 is mounted.

Load-lock chambers 80A and 80B are coupled via gate valves to the side wall of the process chamber 5. A wafer transfer arm 81 transfers a wafer between the load-lock chamber 80A or 80B and the wafer holder 50A or 50B. The details of this wafer transfer method will be given later with reference to FIG. 4.

Next, with reference to FIGS. 2A to 2D and FIGS. 3A and 3B, a wafer transport method to be performed during ion implantation will be described.

As shown in FIG. 2A, the wafer holders 50A and 50B holding wafers perpendicularly to the Z axis are aligned on a line with a constant space therebetween and moved downward (to the +X direction). Ions are implanted while each wafer traverses the region (ion beam radiation region 1E) covered by the ion current detector 60. The wafer holder 50B is positioned under the wafer holder 50A and the state immediately after the upper end of the wafer holder 50B escapes from the ion beam radiation region 1E is shown in FIG. 2A, which corresponds to the state shown in FIG. 1B.

Figure 2B:
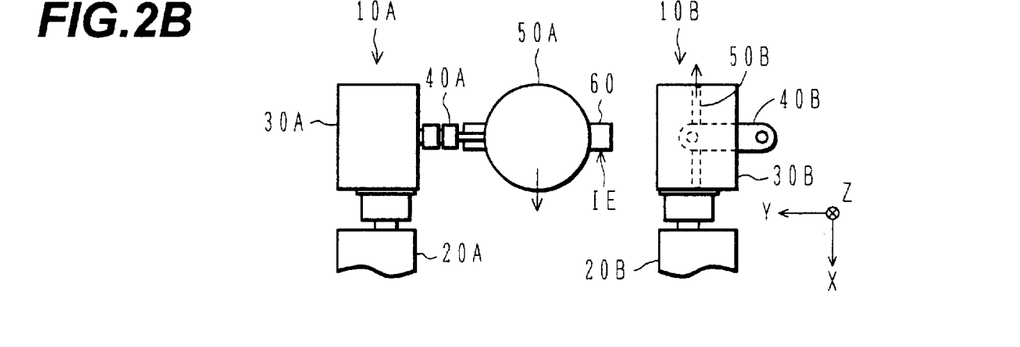
Figure 3B:
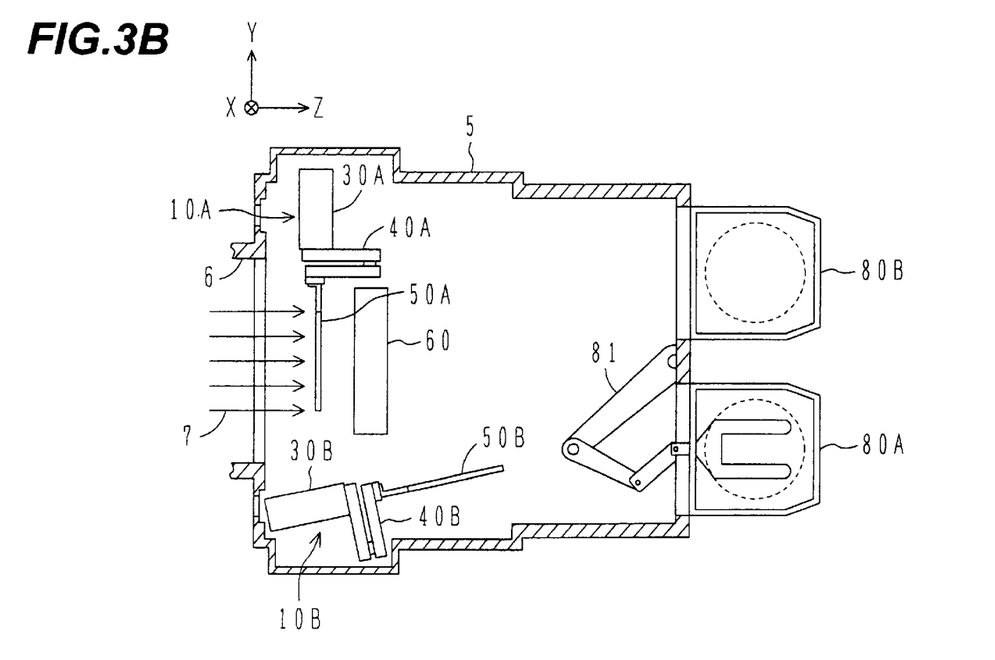

As shown in FIG. 2B, the horizontal rotation mechanism 20B is driven to rotate the arm drive mechanism 30B by about 80° around the rotary axis in parallel to the X axis. FIG. 3B is a schematic plan view in section showing the state after the arm drive mechanism 30B was rotated. As the arm drive mechanism 30B rotates, the expandable arm 40B and wafer holder 50B rotate, and the wafer holder 50B is retracted to the rear and side of the ion current detector 60.

As shown in FIG. 2B, the wafer is moved up (to the −X direction in a linear motion) by driving the expandable arm 40B. FIG. 2B shows the state when the center of the wafer holder 50B rises to the height generally the same as that of the ion current detector 60. Also during this period, the wafer holder 50A moves downward at a constant speed.

Figure 2C:
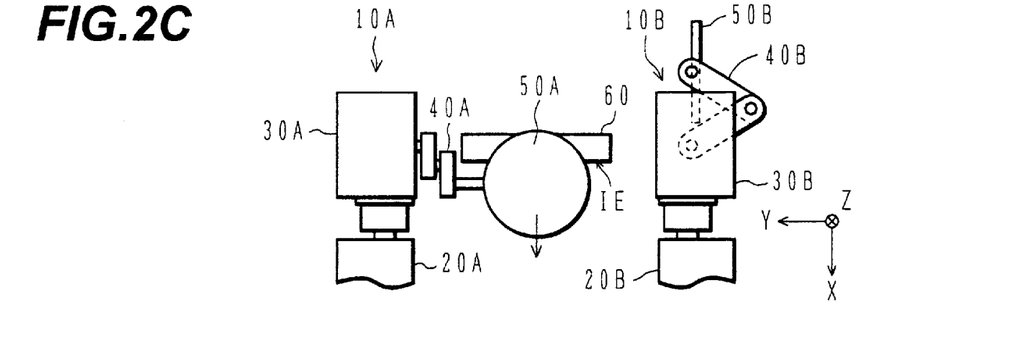

As shown in FIG. 2C, when the lower end of the wafer holder 50B rises to the position slightly higher than the upper end of the ion current detector 60, the wafer holder 50B is stopped rising.

Figure 2D:
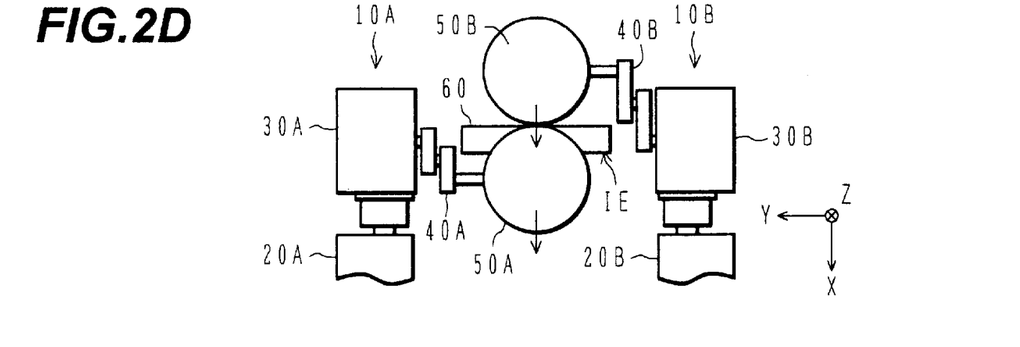

As shown in FIG. 2D, the arm drive mechanism 30B is rotated by driving the horizontal rotation mechanism 20B to position the wafer holder 50B slightly higher than the wafer holder 50A. Then, the wafer holders 50A and 50B are lowered with the fixed positional relationship of the two holders 50A and 50B.

When the upper end of the wafer holder 50A escapes from the ion beam radiation region 1E, the horizontal rotation mechanism 20A and arm drive mechanism 30A are driven similar to the case shown in FIGS. 2B and 2C to thereby transport the wafer holder 50a above the wafer holder 50B. As the wafer holders 50A and 50B are lowered, the state shown in FIG. 2A is recovered.

The above operations are repetitively performed as necessary to complete ion implantation of the wafers.

As shown in FIGS. 2A and 2D, during ion implantation, the path of each wafer is generally the same. During the processes shown in FIGS. 2B and 2C, the wafer held by the wafer holder 50B rises along the path on the right side of the ion current detector 60, whereas the wafer held by the wafer holder 50A rises along the path on the left side of the ion current detector 60.

As above, the two wafers move on the same paths during ion implantation and on different paths during the period without ion implantation. Such orbital paths can provide efficient ion implantation of two wafers. The paths of the two wafers during ion implantation are not required to be coincident, so long as the two paths intersect with the ion beam progressing path.

The ion implantation region moves from the lower end to the upper end of each wafer. This motion direction does not change. If a wafer is moved reciprocally during ion implantation, the motion direction of the ion implantation region is reversed. When the direction is reversed, ion implantation starts from the region where the ion implantation was finished just before. Therefore, there is a possibility that cooling of the wafer becomes insufficient in some region in the wafer. With the method illustrated in FIGS. 2A to 2D, however, the motion direction of the ion implantation region is the same at all times. Therefore, the cooling efficiency is not irregular over the whole area of a wafer and efficient cooling can be realized.

Next, with reference to FIG. 4, a wafer transfer method of transferring a wafer between the load-lock chamber and wafer holder will be described.

Figure 4:
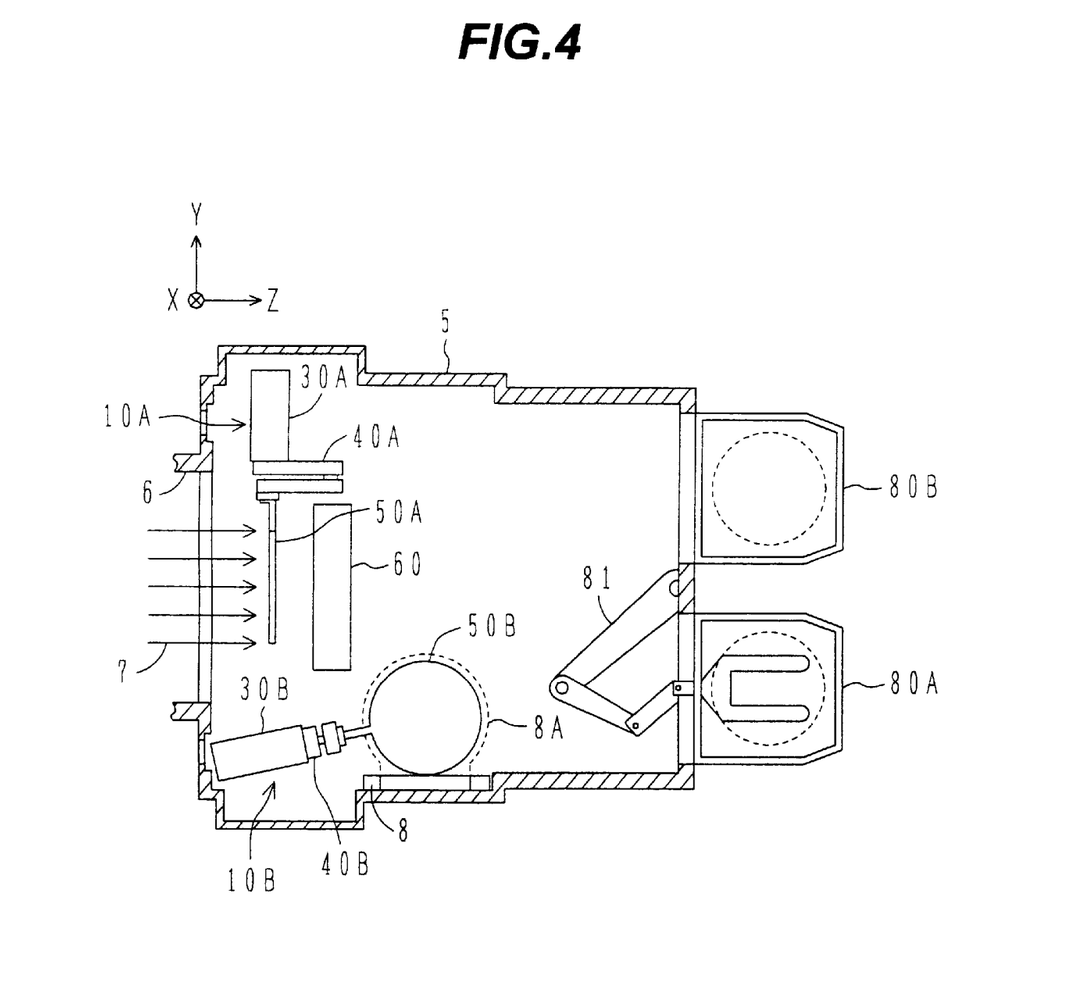

FIG. 4 is a schematic plan view in section showing an ion implantation system similar to that shown in FIGS. 3A and 3B. The expandable arm 40B can move the wafer holder 50B linearly in the X direction, and also can rotate it about 90° around the rotary axis in parallel to the YZ plane.

The wafer holder 50B is rotated about 90° around the rotary axis in parallel to the YZ plane, in the state that the wafer holder 50B is retracted to the rear and side of the ion current detector 60 as shown in FIG. 3B.

As shown in FIG. 4, the wafer holding surface of the wafer holder 50B becomes in parallel to the YZ plane, the wafer being held in this state. The thermal conduction media gas, which has been supplied into the space between the wafer holding surface and the wafer, is stopped and wafer suction by the electrostatic chuck is released.

A wafer lift mechanism 8 housed in the process chamber 5 in a mount state contacting the inner surface of the chamber 5 is then lifted and moved to the lower position of the wafer holder 50B as indicated by a broken line 8a. A plurality of pins mounted on this wafer lift mechanism 8 contact the area near the outer periphery of the back surface of the wafer to lift it a little over the wafer holding surface. The tip of a transfer arm 81 is inserted between the wafer and the wafer holding surface and raised to lift the wafer. The transfer arm 81 transfers the wafer held by the tip to the inside of a load-lock chamber 80A. Next, a new wafer still not processed is picked up from the load-lock chamber 80A and placed on the pins of the wafer lift mechanism 8. The wafer lift mechanism 8 is housed in the original place to place the wafer on the wafer holding surface of the wafer holder 50B. This wafer is sucked by the electrostatic chuck and thermal conduction media gas is introduced into the space between the wafer holding surface and the wafer. The wafer holder 50B is rotated by 90° to hold the wafer upright.

The arm drive mechanism 30B is then rotated to hold the wafer perpendicular to the Z axis. The processes described with FIGS. 2A to 2D are repeated to again perform ion implantation.

The wafer held by the wafer holder 50A can be exchanged in the manner similar to the wafer holder 50B.

While a wafer held by the wafer holder of one wafer transport mechanism is exchanged, the other wafer transport mechanism may be driven singularly to continue ion implantation, or alternatively the wafer holder of the other wafer transport mechanism may be retracted to the rear and side of the ion current detector 60 to intercept ion implantation. If ion implantation is performed while only one wafer transport mechanism is driven, the wafer holder of this mechanism may be moved reciprocally in succession.

During the period while a wafer in the load-lock chamber 80A is exchanged, the gate valve of the other load-lock chamber 80B is maintained closed.

The operations of the horizontal rotation mechanisms 20A and 20B and arm drive mechanisms 30A and 30B during the above-described processes are controlled by the controller 70 shown in FIG. 2A.

Figure 5:
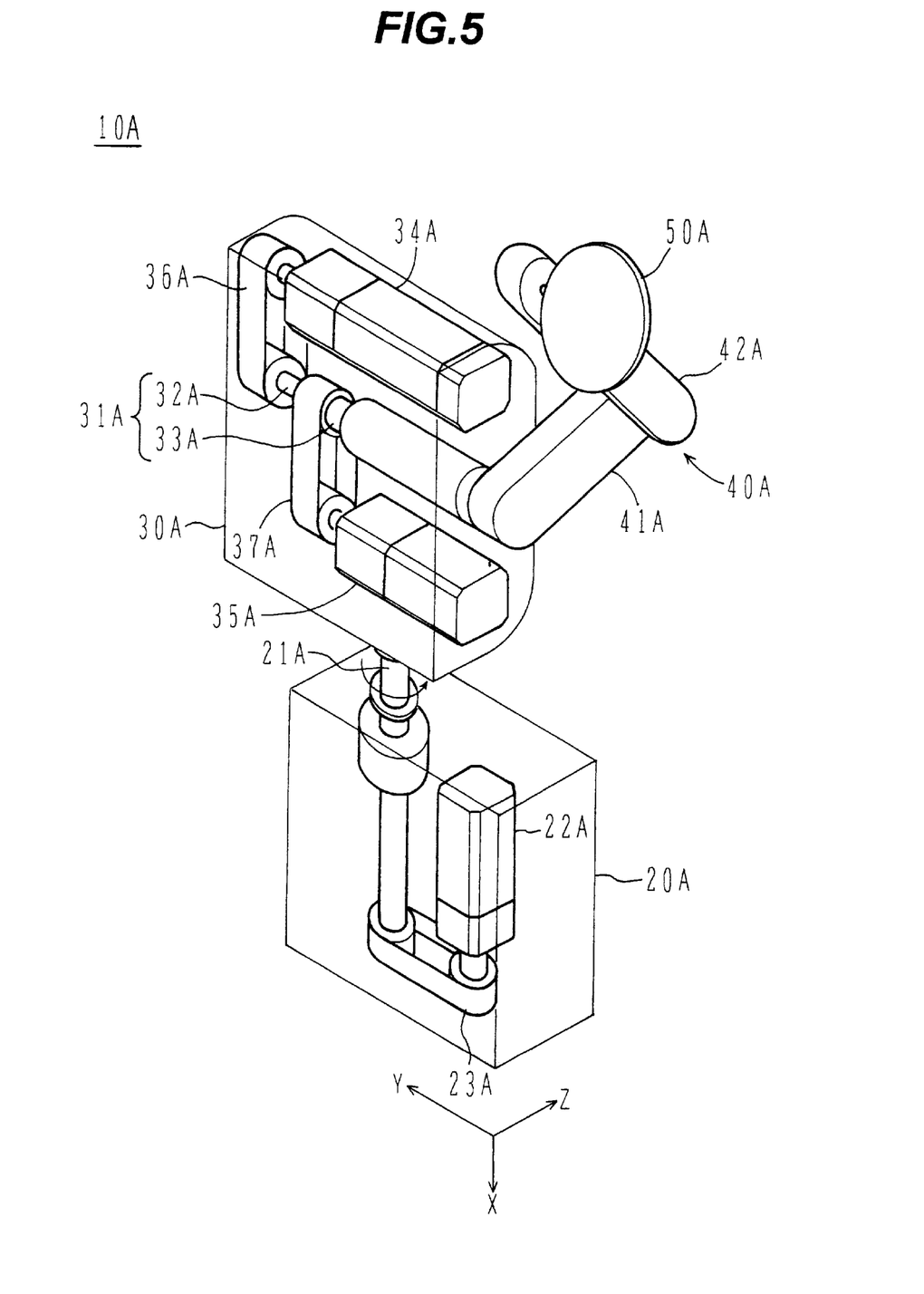
FIG. 5 is a perspective view showing the outline of a wafer transport mechanism of the ion implantation system according to the embodiment of the invention.

FIG. 5 is a perspective view showing the outline of the wafer transport mechanism 10A. The other wafer transport mechanism 10B has a structure mirror-symmetrical with the wafer transport mechanism 10A.

The horizontal rotation mechanism 20A is constituted of a horizontal rotary shaft 21A and a motor 22A. A timing belt 23A extends between the horizontal rotary shaft 21A and the motor 22A. As the motor 22A is driven, the horizontal rotary shaft 21A rotates.

The arm drive mechanism 30A is mounted on the top end of the horizontal rotary shaft 21A. As the motor 22A is driven, the arm drive mechanism 30A can be rotated around the horizontal rotary shaft 21A. The arm drive mechanism 30A is constituted of an arm drive shaft 31A of a biaxial structure, and motors 34A and 35A. The arm drive shaft 31A has a center shaft 32A and an outer shaft 33A respectively supported horizontally.

A timing belt 36a extends between the center shaft 32A and the drive shaft of the motor 34A which rotates the center shaft 32A. Another timing belt 37A extends between the outer shaft 33A and the drive shaft of the motor 35A which rotates the outer shaft 33A.

The expandable arm 40A is constituted of a first sub-arm 41A mounted on the outer shaft 33A and a second sub-arm 42A rotatively mounted on the distal end of the first sub-arm 41A. The wafer holder 50A is rotatively mounted on the distal end of the second sub-arm 42A.

If the center and outer shafts 32A and 33A are rotated at the same time, the expandable arm 40A rotates without changing the relative positions of the first and second sub-arms 41A and 42A and wafer holder 50A. If the outer shaft 33A only is rotated while the center shaft 32A is remained stationary, the expandable arm 40A expands or contracts by changing the angle between the first and second sub-arms 41A ad 42A. Even if the expandable arm 40A expands or contracts, the direction of the wafer holding surface does not change because the wafer holder 50A changes the angle between its wafer holding surface and the second sub-arm 42A in accordance with a change in expansion/contraction of the expandable arm 40A.

Therefore, as the outer shaft 33A is rotated with the center shaft 32A being remained stationary, the wafer holder 50A can be translated linearly in one direction. The direction of the wafer holding surface of the wafer holder 50A can be changed only when both the center and outer shafts 32A and 33A are rotated at the same time.

Next, with reference to FIGS. 6 to 8, the structures of the arm drive mechanism 30A, expandable arm 40A and wafer holder 50A will be described. The other arm drive mechanism 30B, expandable arm 40B and wafer holder 50B shown in FIG. 2A have the same structures. In order to make it easy to understand, components fixed together are shown in unison in FIGS. 6 to 8. However, in actual, they are made of discrete components and fixed by screws or the like depending on the conditions of manufacture, assembly or other factors.

Figure 6:
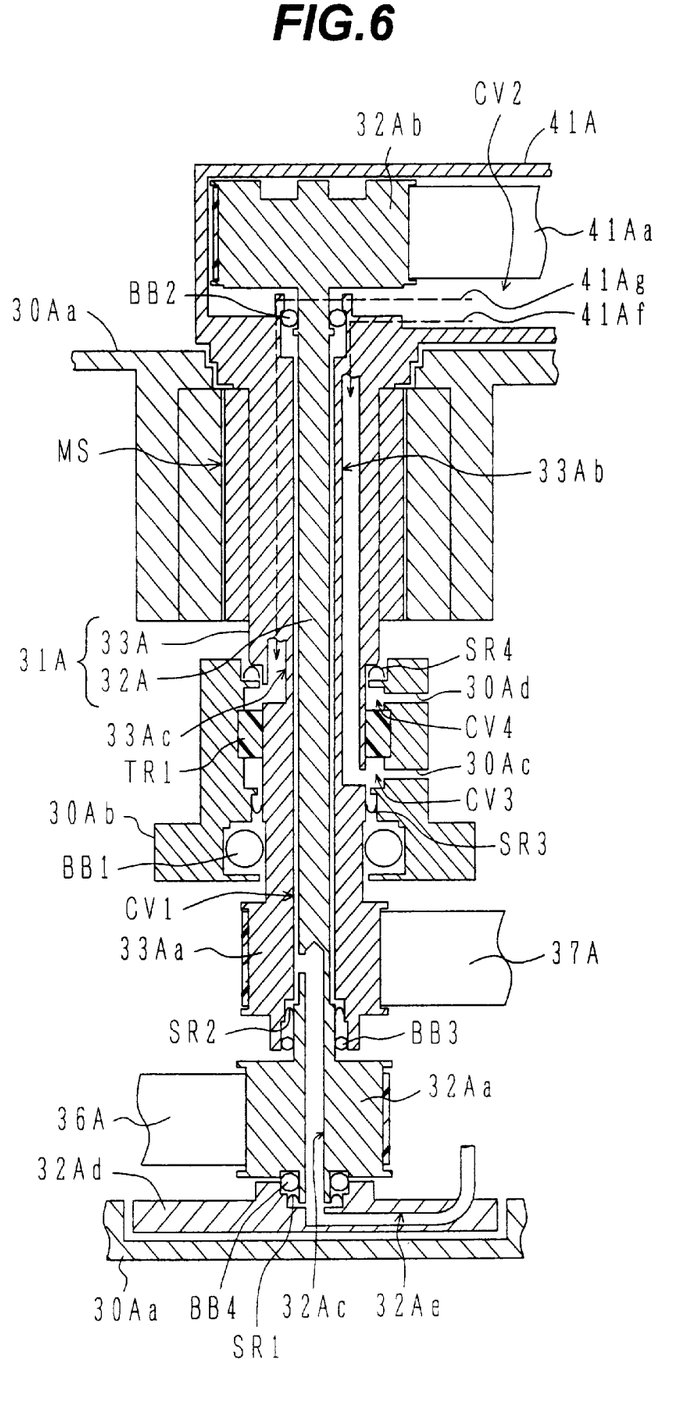
FIG. 6 is a cross sectional view showing a coupling portion between an arm drive mechanism and an arm shown in FIG. 5.

FIG. 6 is a partial cross sectional view of the arm drive shaft 31A inclusive of the center shaft. The arm drive shaft 31A is constituted of, as described earlier, the center and outer shafts 32A and 33A. The outer shaft 33A is fixed to the first sub-arm 41A, and inserted into a bearing 30A$b$ fixed to and mounted in a housing 30A$a$.

The outer shaft 33A is rotatively supported by the housing 30A$a$ via a magnetic fluid seal MS and a ball bearing BB1. The inside and outside of the housing 30A$a$ is separated in air-tight by the magnetic fluid seal MS. The center shaft 32A is rotatively supported by the outer shaft 33A by ball bearings BB2 and BB3.

A pulley 33A$a$ is mounted on the proximal end of the outer shaft 33A. The timing belt 37A extends between the drive shaft of the motor 35A shown in FIG. 5 and the pulley 33A$a$ so that as the motor 35A rotates, the outer shaft 33A rotates.

Another pulley 32A$a$ is coaxially mounted near on the proximal end of the center shaft 32A inserted into the outer shaft 33A. The timing belt 36A extends between the pulley 32A$a$ and the drive shaft of the motor 34A shown in FIG. 5.

The distal end of the center shaft 32A is inserted into the first sub-arm 41A, and a pulley 32A$b$ is mounted on the distal end of the center shaft 32A.

A gas flow passage 32A$c$ is formed in the center shaft 32A, this passage opening its one end and outer circumferential surface. The gas flow passage 32A$c$ connects at its one end with another gas flow passage 32A$e$ formed in a gas flow passage coupling member 32A$d$. This coupling member 32A$d$ is rotatively coupled to the center shaft 32A by a ball bearing BB4, and fitted into a recess formed in the housing 30A$a$. A coupling area between the gas flow passages 32A$c$ and 32A$e$ is sealed with a sealing member SR1.

The gas flow passage 32A$c$ also connects at its outer cicumferential surface with a cavity CV1 defined between the center and outer shafts 32A and 33A.

The cavity CV1 and the space in the housing 30A$a$ are separated in air-tight by a sealing member SR2. The cavity CV1 communicates with another cavity CV2 in the first sub-arm 41A via an area where the ball bearing BB2 is mounted. A vacuum pump (not shown) connected to the gas flow passage 32A$e$ can evacuate the cavity CV2 in the first sub-arm 41A.

The outer shaft 33A is provided with two cooling water paths 33A$b$ and 33A$c$ whose one ends open at the outer circumferential surface of the outer shaft 33A and connect with ring-shaped cavities CV3 and CV4 defined between the outer shaft 33A and bearing holder 30A$b$. These cavities CV3 and CV4 are separated from each other by a Teflon ring TR1. The cooling water paths 33A$b$ and 33A$c$ constitute a supply path and a return path of cooling water, respectively. Small water leakage between the two cooling water paths does not become a critical operation problem. Therefore, separation by the Teflon ring TR1 provides a sufficient performance. The cavities CV3 and CV4 are separated in air-tight from the inside of the housing 30A*a* by sealing members SR3 and SR4.

The cavities CV3 and CV4 communicate with cooling water paths 30A*c* and 30A*d* formed in the bearing holder 30A*b*. Cooling water can be introduced into the cooling water path 33A*b* via the cooling water path 30A*c* and cavity CV3. The cooling water in the cooling water path 33A*c* can be drained via the cavity CV4 and cooling water path 30A*d*. The cooling water paths 33A*b* and 33A*c* connect with cooling water pipes 41A*f* and 41A*g* disposed in the first sub-arm 41A.

Figure 7:
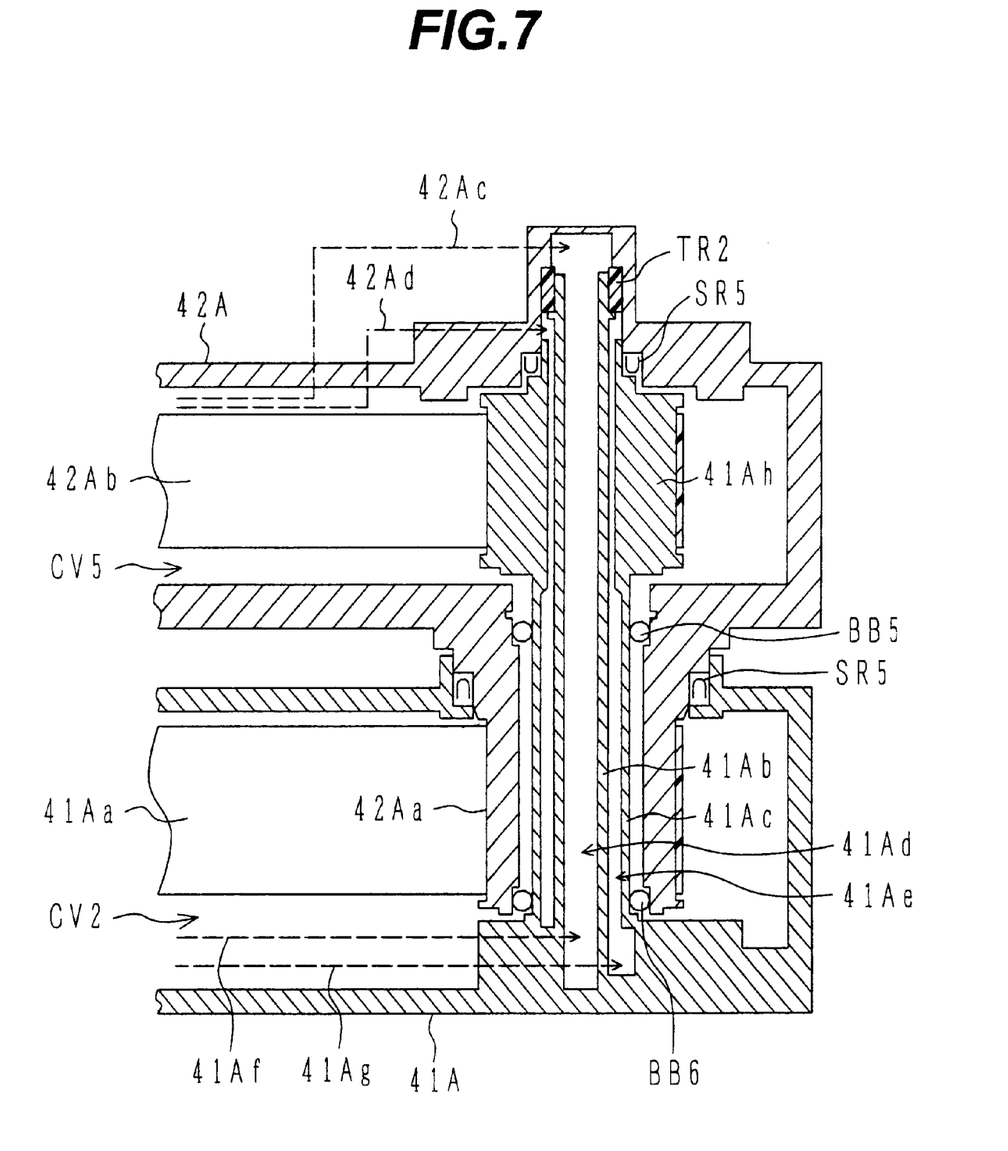
FIG. 7 is a cross sectional view showing a coupling portion between a first sub-arm and a second sub-arm shown in FIG. 5.

FIG. 7 is a cross sectional view showing a coupling area between the first sub-arm 41A and second sub-arm 42A shown in FIG. 5.

Center and outer hollow shafts 41A*b* and 41A*c* are coaxially mounted on the distal end of the first sub-arm 41A. One ends of the center and outer shafts 41A*b* and 41A*c* are fixed to the inner wall of the first sub-arm 41A. The other ends thereof pass through the side wall of the first sub-arm 41A and extend to the outside.

A hollow rotary shaft 42A*a* is fixed to the proximal end of the second sub-arm 42A. The center and outer shafts 41A*b* and 41A*c* are inserted into this rotary shaft 42A*a* which is rotatively mounted on the first sub-arm 41*a* by ball bearings BB5 and BB6. The inner cavity CV2 of the first sub-arm 41A and an inner cavity CV5 of the second sub-arm 42A connect with each other via a cylindrical cavity defined between the inner surface of the rotary shaft 42A*a* and the outer surface of the outer shaft 41A*c*. The coupling area between the outer surface of the first sub-arm 41A and the outer surface of the second sub-arm 42A is made air-tight by a sealing member SR5. As the inside of the inner cavity CV2 is evacuated, the inside of the inner cavity CV5 is evacuated at the same time.

The rotary shaft 42A*a* is coupled via the timing belt 41A*a* to the pulley 32A*b* shown in FIG. 6. A pulley 41A*h* is mounted on the distal end of the outer shaft 41A*c* inserted into the inner cavity CV5 of the second sub-arm 42A. A timing belt 42A*b* is coupled to the pulley 41A*h*.

The center shaft 41A*b* defines therein a cooling water path 41A*d*. Another cooling water path 41A*e* is defined between the outer surface of the center shaft 41A*b* and the inner surface of the outer shaft 41A*c*. The cooling water path 41A*d* communicates via the cooling water pipe 41A*f* with the cooling water path 33A*b* shown in FIG. 6, whereas the cooling water path 41A4 communicates via the cooling water pipe 41A*g* with the cooling water path 33A*c* shown in FIG. 6.

The ends of the cooling water paths 41A*d* and 41A*e* on the side of the second sub-arm 42A are closed by the inner surface of the second sub-arm 42A. A sealing member SR5 mounted on the distal end of the outer shaft 41A*c* separates the cooling water path 41A*e* from the inner cavity CV5, and a Teflon ring TR2 fitted in at the distal end of the center shaft 41A*b* separates the cooling water paths 41A*d* and 41A*e*.

Cooling water pipes 42A*c* and 42A*d* disposed in the second sub-arm 42A connect with the cooling water paths 41A*d* and 41A*e*, respectively.

In the structure shown in FIG. 7, the insides of the cooling water paths 41A*d* and 41A*e* are not separated from the outside of the arms 41A and 42A by sealing members. Instead, the cooling water path 41A*d* is positioned only near the cooling water path 41A*e* via the Teflon ring TR2, and the cooling water path 41A*e* is positioned only near the inner cavity CV5 via the sealing member SR5. Accordingly, even if water leaks from the cooling water paths via mechanically sliding components, it will not be drained to the outside of the arms 41A and 42A, i.e., to the inside of the process chamber 5 shown in FIG. 3A.

It is therefore possible to circulate cooling water via the rotating components of the arms, without lowering the vacuum degree of the inside of the process chamber 5.

Figure 8:
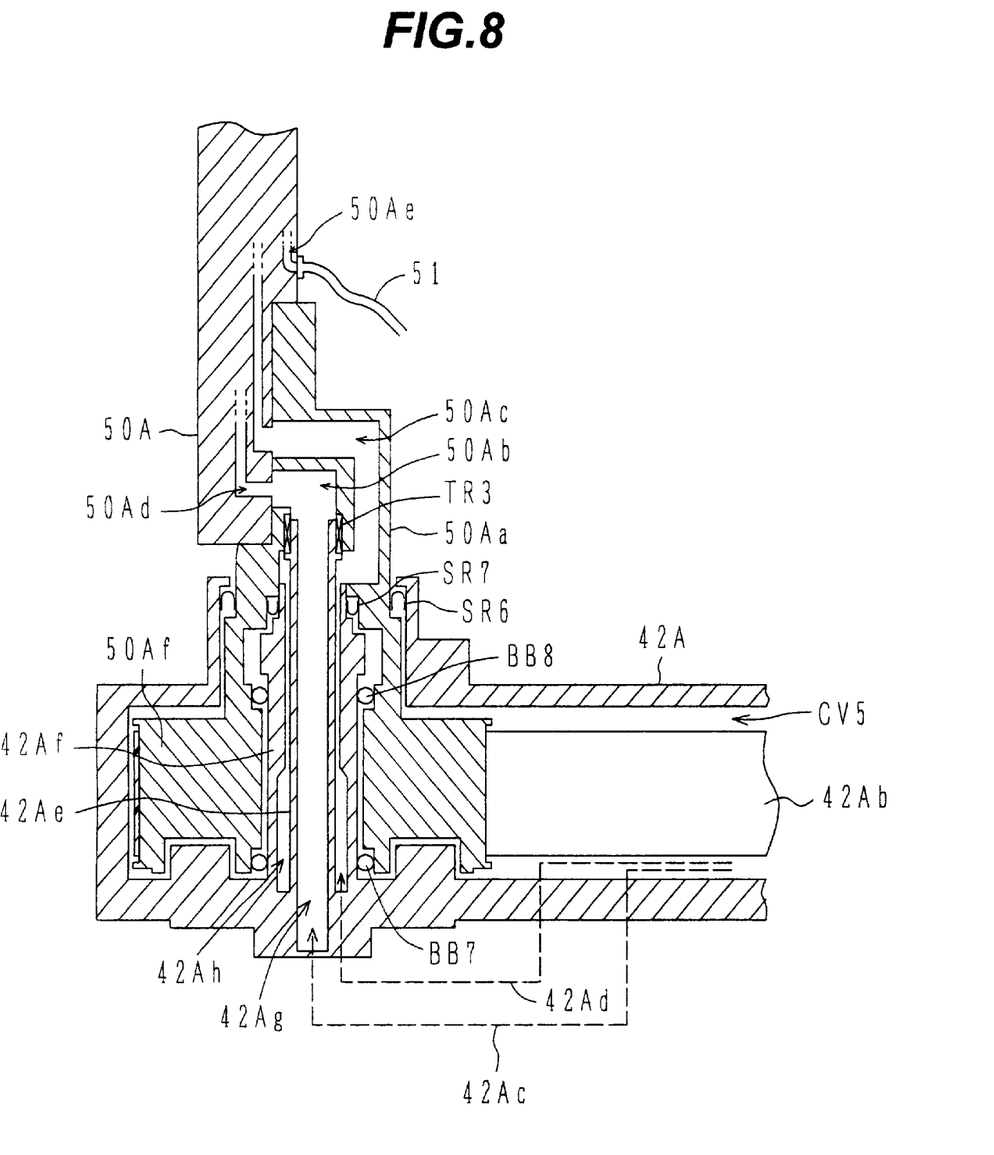
FIG. 8 is a cross sectional view showing a coupling portion between a second sub-arm and a wafer holder shown in FIG. 5.

FIG. 8 is a cross sectional view showing a coupling area between the second sub-arm 42A and wafer holder 50A shown in FIG. 5. The fundamental structure of this coupling area is the same as that of the first and second sub-arms 41A and 42A shown in FIG. 7.

Center and outer shafts 42A*e* and 42A*f* are mounted on the distal end of the second sub-arm 42A. A cooling water path 42A*g* disposed in the center shaft 42A*e* connects via the cooling water pipe 42A*c* with the cooling water path 41A*d* shown in FIG. 7, and another cooling water path 42A*h* defined between the center and outer shafts 42A*e* and 42A*f* communicates via the cooling water pipe 42A*d* with the cooling water path 41A*e* shown in FIG. 7.

A rotary shaft 50A*a* and a pulley 50A*f* fixed to the wafer holder 50A are fitted around the center and outer shafts 42A*e* and 42A*f* and rotatively supported by ball bearings BB7 and BB8. A timing belt 42A*b* extends between the pulley 50A*f* and the pulley 41A*h* shown in FIG. 7. A sealing ring SR6 Is inserted in the sliding area between the second sub-arm 42A and rotary shaft 50A*a* to maintain the arm and shaft air-tight.

Cooling water paths 50A*b* and 50A*c* are formed in the rotary shaft 50A*a* which communicate with the cooling water paths 42A*g* and 42A*h*, respectively. The coupling area between the cooling water paths 42A*h* and 50A*c* is separated from the inner cavity CV5 by a sealing ring SR7, and the cooling water supply and return paths are separated by a Teflon ring TR3.

A cooling water loop path 5OA*d* is formed in the wafer holder 50A, and both ends of this path 50A*d* communicate with the cooling water paths 50A*b* and 50A*c*.

Cooling water supplied from the cooling water path 30A*c* shown in FIG. 6 is conveyed to the cooling water path 50A*d* via the cavity CV3, cooling water path 33A*b*, cooling water pipe 41A*f*, cooling water path 41A*d*, cooling water pipe 42A*c*, and cooling water paths 42A*g* and 50A*b*. Water flowing in the cooling water path 50A*d* and cooled a wafer held by the wafer holder 50A, is recovered after passing through the cooling water paths 50A*c* and 42A*h*, cooling water pipe 42A*d*, cooling water path 41A*e*, cooling water pipe 41A*g*, cooling water path 33A*c*, cavity CV4 and cooling water path 30A*d*.

A gas flow passage 50A*e* is formed in the wafer holder 50A, this passage being used for introducing thermal conduction media gas into a space between a wafer and the wafer holding surface. The gas flow passage 50*ae* opens in the area different from the wafer holding surface and connects with a flexible gas tube 51. This gas tube 51 extends to the outside of the process chamber shown in FIG. 3A. Gas can therefore be introduced into the space between a wafer and the wafer holding surface via the gas tube 51 and gas flow passage 50A*e*. For example, argon gas or the like is supplied.

The insides of the cavities CV2 and CV5 of the sub-arms can be evacuated via the gas flow passage 32A*e* shown in FIG. 6. Prior to ion implantation, the inside of the process chamber 5 shown in FIG. 3*a* is evacuated to about $1 \times 10^{-6}$ to $1 \times 10^{-5}$ Torr, and the insides of the inner cavities CV2 and CV5 of the sub-arms are evacuated to about 0.1 to 1 Torr. The evacuation of the inner cavities CV2 and CV5 to this degree can provide sufficient air-tightness using the seal ring SR5 and SR6 shown in FIG. 7 and 8.

Next, the motion of the arms will be described. A gear ratio of the pulley 32A*b* shown in FIG. 6 to the rotary shaft 42A*a* shown in FIG. 7 is 2:1. A gear ratio of the pulley 41A*h* shown in FIG. 7 to the pulley 50A*f* shown in FIG. 8 is 1:2.

Referring to FIG. 6, as only the outer shaft 33A is rotated by remaining the center shaft 32A stationary, the first sub-arm 41A rotates so that the second sub-arm 42A and wafer holder 50A rotate by the amounts corresponding to the gear ratio of each pulley. If the lengths of the first and second sub-arms 41A and 42A are equal, the wafer holder 50A moves linearly in one direction without changing the direction of its wafer holder surface. As the wafer holder 50A translates linearly, the wafer can be transported as illustrated in FIGS. 2A to 2D.

Referring also to FIG. 6, as both the center and outer shafts 32A and 33A are rotated at the same time by the same rotary angle, the first and second sub-arms 41A and 42A and wafer holder 50A rotate while maintaining constant the positional relationship therebetween. By rotating the arms without changing their positional relationship, it becomes possible to make the direction of the wafer holding surface horizontal as described with FIG. 4.

In the above embodiment, ion implantation is performed by positioning a wafer vertical to the ion beam progressing direction, as described with reference to FIGS. 2A to 4. If the wafer holding surface is inclined relative to the ion beam and the arms are contracted and expanded, ions can be implanted obliquely to a wafer.

Figure 9:
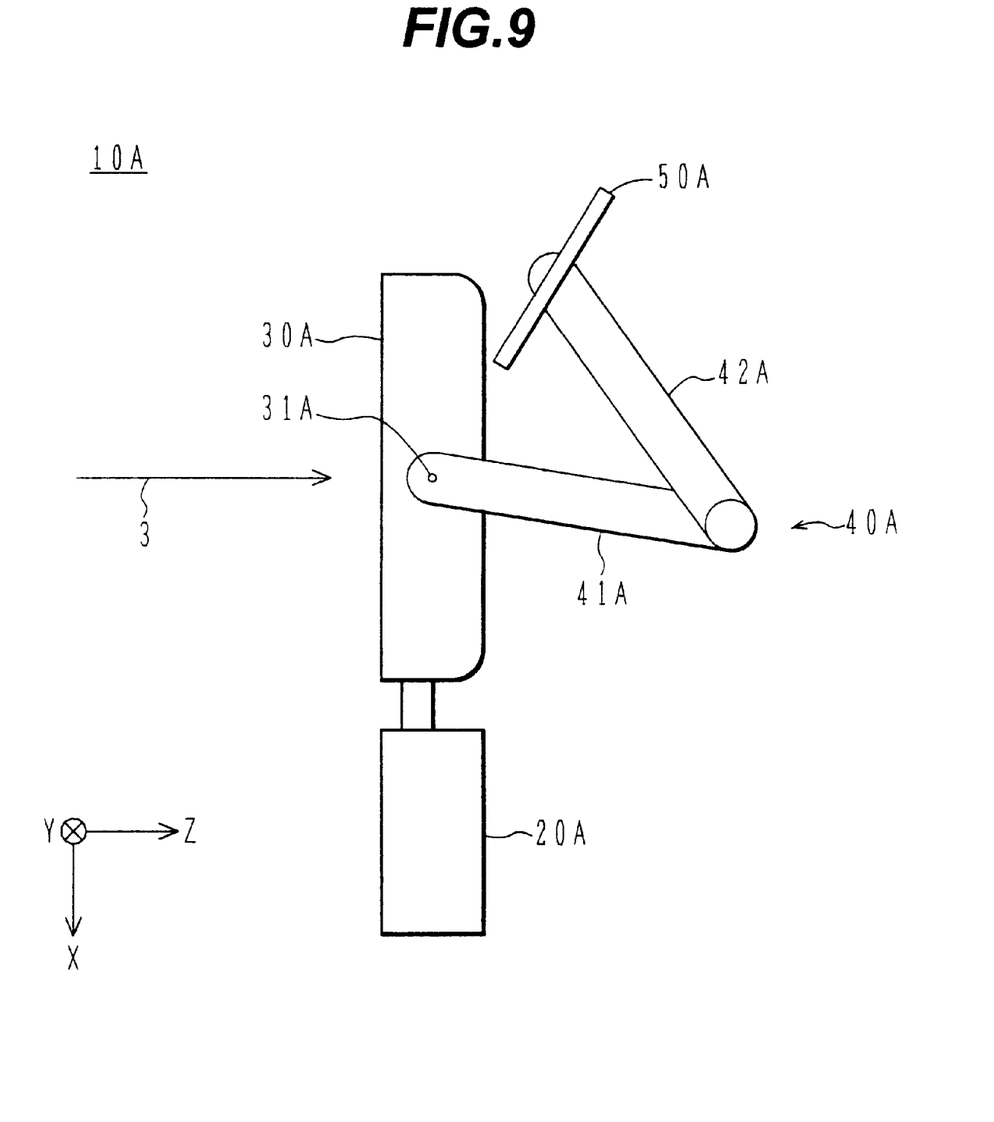
FIG. 9 is a side view showing a wafer transport mechanism in which a wafer holding surface is inclined relative to an ion beam.

FIG. 9 is a side view showing the wafer transport mechanism 10A in which the wafer holding surface is inclined relative to an ion beam. In order to incline the wafer holding surface of the wafer holder 50A relative to the progressing direction of an ion beam 3, for example, the center and outer shafts of the arm drive shaft 31*a* are rotated at the same time by a desired angle to rotate the expandable arm 40A while fixing the posture of the expandable arm 40A and maintaining constant the positional relationship between the expandable arm 40A and wafer holder 50A.

In this state, only the outer shaft is rotated while the center shaft of the arm drive shaft 31A is fixed, to thereby expand and contract the expandable arm 40A. In this case, the wafer holding surface of the wafer holder 50A being inclined relative to the progressing direction of the ion beam 3 traverses the ion beam 3. In this way, ions can be implanted obliquely to the wafer.

Since the wafer holding surface and its motion direction are parallel, any area of the wafer surface traverses the ion beam 3 at the same position in the Z axis direction. Therefore, ions can be implanted uniformly over the whole surface of the wafer.

If the height (position in the X axis direction) of the arm drive shaft 31A is set equal to the height of the path of the ion beam 3, a cross point between the path of the wafer holding surface and the path of the ion beam 3 varies scarcely even if the inclination angle of the wafer holding surface is changed relative to the progressing direction of the ion beam 3. Namely, the cross point between the path of the wafer holding surface and the path of the ion beam 3 does not depend on the inclination angle of the wafer holding surface relative to the progressing direction of the ion beam 3. Accordingly, even if the angle of the ion implantation is changed, the intensity of the ion beam 3 on the wafer surface can be made constant.

The present invention has been described in connection with the preferred embodiments. The invention is not limited only to the above embodiments. It is apparent that various modifications, improvements, combinations, and the like can be made by those skilled in the art.

What is claimed is:

1. An ion implantation method wherein ion implantation is performed while a first wafer group including at least one or more wafers is rotated along a first orbital path intersecting with a path of an ion beam and while a second wafer group including at least one or more wafers is rotated along a second orbital path intersecting with the path of the ion beam, at least a portion of said second orbital path being different from said first orbital path.

2. An ion implantation method according to claim 1, wherein said first and second orbital paths intersect with the path of the ion beam at the same position.

3. An ion implantation method according to claim 1, wherein:
   the path of the ion beam has a width along said first and second orbital paths; and
   said first and second wafer groups are rotated so that before one of said first and second wafer groups escapes from the path of the ion beam, the other enters the path of the ion beam.

4. An ion implantation method comprising the steps of:
   implanting ions while a first wafer is moved along one direction intersecting with a path of an ion beam;
   implanting ions to partial areas of said first wafer and a second wafer at the same time, by moving said second wafer along the one direction into the path of the ion beam before said first wafer perfectly escapes from the path of the ion beam;
   implanting ions while said second wafer is moved along the one direction after said first wafer perfectly escapes from the path of the ion beam; and
   implanting ions to partial areas of said first second wafers at the same time, by moving said first wafer along the one direction into the path of the ion beam before said second wafer perfectly escapes from the path of the ion beam.

5. An ion implantation method of implanting ions by rotating first and second wafer groups each including at least one or more wafers along respective first and second orbital paths having at least a common orbital section intersecting with a path of an ion beam, wherein a relative distance between said first and second wafer groups along said first or second orbital paths varies while one of said first and second wafer groups moves on the common orbital section.

6. An ion implantation method of implanting ions by rotating first and second wafer groups each including at least one or more wafers along a common orbital path, wherein a distance between said first and second wafer groups along said common orbital path varies.

7. An ion implantation system comprising:
   first wafer transport means for holding at least one or more wafers and rotating at least one or more wafers along a first orbital path intersecting with a path of an ion beam; and
   second wafer transport means for holding at least one or more wafers and rotating at least one or more wafers along a second orbital path intersecting with a path of an ion beam.

8. An ion implantation system according to claim 7, wherein said first orbital path is different from said second orbital path.

9. An ion implantation system according to claim 7, wherein:

the path of the ion beam has a width along said first and second orbital paths; and said first and second wafer transport means rotate each wafer so that before a wafer held by one of said first and second wafer transport means escapes from the path of the ion beam, a wafer held by the other of said first and second wafer transport means enters the path of the ion beam.

10. An ion implantation system according to claim 7, wherein said first and second orbital paths have at least a common orbital section intersecting with the path of the ion beam, and said first and second wafer transport means rotate each wafer so that a distance between first and second wafers held by said first and second transport means, along said first or second orbital paths, varies while the first wafer held by said first wafer transport means moves on the common orbital section.

11. An ion implantation system according to claim 7, wherein said first and second wafer transport means hold and rotate wafers along a common orbital path while changing a relative distance between the wafers.

12. An ion implantation system according to claim 7, wherein each of said first and second wafer transport means can incline a wafer holding surface relative to the path of the ion beam, can rotate wafers without varying a cross point between said first and second orbital paths and the path of the ion beam.

13. An ion implantation system according to claim 7, wherein:

said first wafer transport means comprises:

a first expandable arm for, holding a wafer at a distal end thereof; and first rotating means for rotating said first expandable arm around an axis in an outer area of the path of the ion beam; and said second wafer transport means comprises:

a second expandable arm for holding a wafer at a distal end thereof; and second rotating means for rotating said second expandable arm around an axis in an outer area of the path of the ion beam.

14. An ion implantation system according to claim 13, further comprising first and second flow paths respectively disposed in said first and second expandable arms for conveying cooling media for cooling a wafer, each of said first and second flow paths having a supply path and a return path.

15. An ion implantation system according to claim 14, wherein:

said first expandable arm include two sub-arms rotatively coupled by a first articulation unit; and the supply path and the return path of said first flow path are formed of a central cavity defined by coaxially disposed two cylindrical portions and a tubular cavity surrounding said central cavity, said central cavity and said tubular cavity are separated by a ring member at a sliding part between two members respectively fixed to the two sub-arms among a side wall defining said central cavity, and said tubular cavity and an inner cavity of the two sub-arms are separated by another ring member at a sliding part between two members respectively fixed to the two sub-arms among a side wall defining an outer surface of said tubular cavity.

* * * * *